United States Patent [19]

Jeong et al.

[11] Patent Number: 5,510,788
[45] Date of Patent: Apr. 23, 1996

[54] DATA CONVERSION APPARATUS

[75] Inventors: Hochang Jeong; Jong-Chul Park, both of Seoul, Rep. of Korea

[73] Assignee: Samsung Electronics Co., Ltd., Suwon-city, Rep. of Korea

[21] Appl. No.: 194,448

[22] Filed: Feb. 9, 1994

[30] Foreign Application Priority Data

Feb. 9, 1993 [KR] Rep. of Korea .................. 1717/93

[51] Int. Cl.⁶ .................................................. H03M 7/42
[52] U.S. Cl. ........................ 341/106; 341/59; 341/65; 341/102; 360/40
[58] Field of Search .................. 341/106, 59, 102

[56] References Cited

U.S. PATENT DOCUMENTS

5,025,256  6/1991  Stevens ...................... 341/59
5,142,421  8/1992  Kahlman ..................... 360/40

Primary Examiner—A. D. Pellinen
Assistant Examiner—Peguy JeanPierre
Attorney, Agent, or Firm—Cushman Darby & Cushman

[57] ABSTRACT

An apparatus for converting source data into modulation data includes a compressed look-up table based on a conversion correlation, a non-effective data discriminator, a group discriminator, an output flag generator, a flag modulator, a control signal generator and an output compensator. A first address having the source data and a original input flag and a second address having the source data and a modulated input flag are sequentially applied to the look-up table which in turn generates first tentative data and a first tentative flag with respect to the first address, generates second tentative data and a second tentative flag with respect to the second address, and produces unique non-effective data when non-effective data is applied. The group discriminator produces a group discrimination signal based on the source data, the non-effective data discriminator produces a non-effective data detection signal when the first tentative data is non-effective data, the output flag generator produces an output flag based on one of the tentative flags and the non-effective data detection signal, and the flag modulator sequentially produces the original input flag and the moduated input flag based on the non-effective data detection signal and output of the output flag generator. The control signal generator produces a control signal based on the non-effective data detection signal and the group discrimination signal. The output compensator produces the modulation data, by modulating the second tentative data in accordance with the control signal.

12 Claims, 5 Drawing Sheets

DATA CONVERSION APPARATUS

This application has priority right based on Korean Patent Application No. 93-1717 filed Feb. 9, 1993, which Korean Application is hereby incorporated by reference.

BACKGROUND OF THE INVENTION

The present invention relates to a data conversion apparatus, and more particularly, to an apparatus for converting eight-bit source data into ten-bit modulation data in accordance with an input flag.

In a digital audio processing system, an audio signal is generally sampled at a rate of 44.1 MHz and then quantized into weight-bit digital source data. The digital source data is then converted into modulation data for compatibility with various recording media. For example, the eight-bit source data of an audio signal recorded onto tape, e.g., a digital compact cassette, is converted into ten-bit modulation data having a bit arrangement Wherein the number of logic "1's" is limited to four, five or six.

Here, each of the 256 possibilities of eight-bit source data is converted into one of two types of ten-bit modulation data, as indicated by an output flag, depending whether an input flag is at a logic "0" or "1". The input flag represents the relationship been the number of logic "1's" and the number of logic "0's" among the converted ten bits of modulation data, with respect to a previous data conversion. For example, an input flag of "0" represents the case where the number of "1" bits was less than or equal to the number of "0" bits present in the immediately preceding modulation data, and an input flag of "1" represents the case when the number of "1" bits was greater than or equal to the number of "0" bits present in the immediately preceding modulation data value.

Here, the input flag is equal to the output flag of the immediately preceding modulation data. Accordingly, for the sake of the balance between the number of "1" bits and the number of "0 bits, the eight-bit source data is converted into ten-bit modulation data having five or six bit "1's" when the input flag is "0" and into that having four or five bit "1's" when the input flag is "1."

Tables 1 through 6 show a recommended conversion of eight-bit source data into ten-bit modulation data and the corresponding output flags, based on the logic state of the input flag.

TABLE 1

| source data (eight bits) | input flag = 0 | | input flag = 1 | |
|---|---|---|---|---|
| | modulation data (ten bits) | output flag | modulation data (ten bits) | output flag |
| 00000000 | 0010101011 | 0 | 0010101011 | 1 |
| 00000001 | 0010101101 | 0 | 0010101101 | 1 |
| 00000010 | 0010101110 | 0 | 0010101110 | 1 |
| 00000011 | 0010110011 | 0 | 0010110011 | 1 |
| 00000100 | 0010110101 | 0 | 0010110101 | 1 |
| 00000101 | 0010110110 | 0 | 0010110110 | 1 |
| 00000110 | 0010111001 | 0 | 0010111001 | 1 |
| 00000111 | 0010111010 | 0 | 0010111010 | 1 |
| 00001000 | 0011001011 | 0 | 0011001011 | 1 |
| 00001001 | 0011001101 | 0 | 0011001101 | 1 |
| 00001010 | 0011001110 | 0 | 0011001110 | 1 |
| 00001011 | 0011010011 | 0 | 0011010011 | 1 |
| 00001100 | 0011010101 | 0 | 0011010101 | 1 |
| 00001101 | 0011010110 | 0 | 0011010110 | 1 |
| 00001110 | 0011011001 | 0 | 0011011001 | 1 |

TABLE 1-continued

| source data (eight bits) | input flag = 0 | | input flag = 1 | |
|---|---|---|---|---|
| | modulation data (ten bits) | output flag | modulation data (ten bits) | output flag |
| 00001111 | 0011011010 | 0 | 0011011010 | 1 |
| 00010000 | 0011100011 | 0 | 0011100011 | 1 |
| 00010001 | 0011100101 | 0 | 0011100101 | 1 |
| 00010010 | 0011100110 | 0 | 0011100110 | 1 |
| 00010011 | 0011101001 | 0 | 0011101001 | 1 |
| 00010100 | 0011101010 | 0 | 0011101010 | 1 |
| 00010101 | 0100101011 | 0 | 0100101011 | 1 |
| 00010110 | 0100101101 | 0 | 0100101101 | 1 |
| 00010111 | 0100101110 | 0 | 0100101110 | 1 |
| 00011000 | 0100110011 | 0 | 0100110011 | 1 |
| 00011001 | 0100110101 | 0 | 0100110101 | 1 |
| 00011010 | 0100110110 | 0 | 0100110110 | 1 |
| 00011011 | 0100111001 | 0 | 0100111001 | 1 |
| 00011100 | 0100111010 | 0 | 0100111010 | 1 |
| 00011101 | 0101001011 | 0 | 0101001011 | 1 |
| 00011110 | 0101001101 | 0 | 0101001101 | 1 |
| 00011111 | 0101001110 | 0 | 0101001110 | 1 |
| 00100000 | 0101010011 | 0 | 0101010011 | 1 |
| 00100001 | 0101010101 | 0 | 0101010101 | 1 |
| 00100010 | 0101010110 | 0 | 0101010110 | 1 |
| 00100011 | 0101011001 | 0 | 0101011001 | 1 |
| 00100100 | 0101011010 | 0 | 0101011010 | 1 |
| 00100101 | 0101100011 | 0 | 0101100011 | 1 |
| 00100110 | 0101100101 | 0 | 0101100101 | 1 |
| 00100111 | 0101100110 | 0 | 0101100110 | 1 |
| 00101000 | 0101101001 | 0 | 0101101001 | 1 |
| 00101001 | 0101101010 | 0 | 0101101010 | 1 |
| 00101010 | 0110001011 | 0 | 0110001011 | 1 |
| 00101011 | 0110001101 | 0 | 0110001101 | 1 |

TABLE 2

| source data (eight bits) | input flag = 0 | | input flag = 1 | |
|---|---|---|---|---|
| | modulation data (ten bits) | output flag | modulation data (ten bits) | output flag |
| 00101100 | 0110001110 | 0 | 0110001110 | 1 |
| 00101101 | 0110010011 | 0 | 0110010011 | 1 |
| 00101110 | 0110010101 | 0 | 0110010101 | 1 |
| 00101111 | 0110010110 | 0 | 0110010110 | 1 |
| 00110000 | 0110011001 | 0 | 0110011001 | 1 |
| 00110001 | 0110011010 | 0 | 0110011010 | 1 |
| 00110010 | 0110100011 | 0 | 0110100011 | 1 |
| 00110011 | 0110100101 | 0 | 0110100101 | 1 |
| 00110100 | 0110100110 | 0 | 0110100110 | 1 |
| 00110101 | 0110101001 | 0 | 0110101001 | 1 |
| 00110110 | 0110101010 | 0 | 0110101010 | 1 |
| 00110111 | 1000101011 | 0 | 1000101011 | 1 |
| 00111000 | 1000101101 | 0 | 1000101101 | 1 |
| 00111001 | 1000101110 | 0 | 1000101110 | 1 |
| 00111010 | 1000110011 | 0 | 1000110011 | 1 |
| 00111011 | 1000110101 | 0 | 1000110101 | 1 |
| 00111100 | 1000110110 | 0 | 1000110110 | 1 |
| 00111101 | 1000111001 | 0 | 1000111001 | 1 |
| 00111110 | 1000111010 | 0 | 1000111010 | 1 |
| 00111111 | 1001001011 | 0 | 1001001011 | 1 |
| 01000000 | 1001001101 | 0 | 1001001101 | 1 |
| 01000001 | 1001001110 | 0 | 1001001110 | 1 |
| 01000010 | 1001010011 | 0 | 1001010011 | 1 |
| 01000011 | 1001010101 | 0 | 1001010101 | 1 |
| 01000100 | 1001010110 | 0 | 1001010110 | 1 |
| 01000101 | 1001011001 | 0 | 1001011001 | 1 |
| 01000110 | 1001011010 | 0 | 1001011010 | 1 |
| 01000111 | 1001100011 | 0 | 1001100011 | 1 |
| 01001000 | 1001100101 | 0 | 1001100101 | 1 |
| 01001001 | 1001100110 | 0 | 1001100110 | 1 |
| 01001010 | 1001101001 | 0 | 1001101001 | 1 |
| 01001011 | 1001101010 | 0 | 1001101010 | 1 |
| 01001100 | 1010001011 | 0 | 1010001011 | 1 |
| 01001101 | 1010001101 | 0 | 1010001101 | 1 |

TABLE 2-continued

| | input flag = 0 | | input flag = 1 | |
|---|---|---|---|---|
| source data (eight bits) | modulation data (ten bits) | output flag | modulation data (ten bits) | output flag |
| 01001110 | 1010001110 | 0 | 1010001110 | 1 |
| 01001111 | 1010010011 | 0 | 1010010011 | 1 |
| 01010000 | 1010010101 | 0 | 1010010101 | 1 |
| 01010001 | 1010010110 | 0 | 1010010110 | 1 |
| 01010010 | 1010011001 | 0 | 1010011001 | 1 |
| 01010011 | 1010011010 | 0 | 1010011010 | 1 |
| 01010100 | 1010100011 | 0 | 1010100011 | 1 |
| 01010101 | 1010100101 | 0 | 1010100101 | 1 |
| 01010110 | 1010100110 | 0 | 1010100110 | 1 |
| 01010111 | 1010101001 | 0 | 1010101001 | 1 |

TABLE 3

| | input flag = 0 | | input flag = 1 | |
|---|---|---|---|---|
| source data (eight bits) | modulation data (ten bits) | output flag | modulation data (ten bits) | output flag |
| 01011000 | 1010101010 | 0 | 1010101010 | 1 |
| 01011001 | 0010101111 | 1 | 0000101011 | 0 |
| 01011010 | 0100101111 | 1 | 0000101101 | 0 |
| 01011011 | 1000101111 | 1 | 0000101110 | 0 |
| 01011100 | 0011001111 | 1 | 0000110011 | 0 |
| 01011101 | 1001110001 | 0 | 0000110101 | 0 |
| 01011110 | 1001011100 | 0 | 0000110110 | 0 |
| 01011111 | 0110001111 | 1 | 0000111001 | 0 |
| 01100000 | 1010001111 | 0 | 0000111010 | 0 |
| 01100001 | 1001101100 | 0 | 0000111100 | 0 |
| 01100010 | 0010110111 | 1 | 0001001011 | 0 |
| 01100011 | 0100101101 | 1 | 0001001101 | 0 |
| 01100100 | 1000110111 | 1 | 0001001110 | 0 |
| 01100101 | 0011010111 | 1 | 0001010011 | 0 |
| 01100110 | 0101010111 | 1 | 0001010101 | 0 |
| 01100111 | 1001010111 | 1 | 0001010110 | 0 |
| 01101000 | 0110010111 | 1 | 0001011001 | 0 |
| 01101001 | 1010010111 | 1 | 0001011010 | 0 |
| 01101010 | 1100010111 | 1 | 0001011100 | 0 |
| 01101011 | 0011100111 | 1 | 0001100011 | 0 |
| 01101100 | 0101100111 | 1 | 0001100101 | 0 |
| 01101101 | 1001100111 | 1 | 0001100110 | 0 |
| 01101110 | 0110100111 | 1 | 0001101001 | 0 |
| 01101111 | 1010100111 | 1 | 0001101010 | 0 |
| 01110000 | 1100100111 | 1 | 0001101100 | 0 |
| 01110001 | 0111000111 | 1 | 0001110001 | 0 |
| 01110010 | 1011000111 | 1 | 0001110010 | 0 |
| 01110011 | 1101000111 | 1 | 0001110100 | 0 |
| 01110100 | 0110110001 | 0 | 0001111000 | 0 |
| 01110101 | 0010111011 | 1 | 0010001011 | 0 |
| 01110110 | 0100111011 | 1 | 0010001101 | 0 |
| 01110111 | 1000111011 | 1 | 0010001110 | 0 |
| 01111000 | 0011011011 | 1 | 0010010011 | 0 |
| 01111001 | 0101011011 | 1 | 0010010101 | 0 |
| 01111010 | 1001011011 | 1 | 0010010110 | 0 |
| 01111011 | 0110011011 | 1 | 0010011001 | 0 |
| 01111100 | 1010011011 | 1 | 0010011010 | 0 |
| 01111101 | 1100011011 | 1 | 0010011100 | 0 |
| 01111110 | 0011101011 | 1 | 0010100011 | 0 |
| 01111111 | 0101101011 | 1 | 0010100101 | 0 |
| 10000000 | 1001101011 | 1 | 0010100110 | 0 |
| 10000001 | 0110101011 | 1 | 0010101001 | 0 |
| 10000010 | 1010101011 | 1 | 0010101010 | 0 |
| 10000011 | 1100101011 | 1 | 0010101100 | 0 |

TABLE 4

| | input flag = 0 | | input flag = 1 | |
|---|---|---|---|---|
| source data (eight bits) | modulation data (ten bits) | output flag | modulation data (ten bits) | output flag |
| 10000100 | 0111001011 | 1 | 0010110001 | 0 |

TABLE 4-continued

| | input flag = 0 | | input flag = 1 | |
|---|---|---|---|---|
| source data (eight bits) | modulation data (ten bits) | output flag | modulation data (ten bits) | output flag |
| 10000101 | 1011001011 | 1 | 0010110010 | 0 |
| 10000110 | 1101001011 | 1 | 0010110100 | 0 |
| 10000111 | 1100001011 | 0 | 0010111000 | 0 |
| 10001000 | 0011110011 | 1 | 0011000011 | 0 |
| 10001001 | 0101110011 | 1 | 0011000101 | 0 |
| 10001010 | 1001110011 | 1 | 0011000110 | 0 |
| 10001011 | 0110110011 | 1 | 0011001001 | 0 |
| 10001100 | 1010110011 | 1 | 0011001010 | 0 |
| 10001101 | 1100110011 | 1 | 0011001100 | 0 |
| 10001110 | 0111010011 | 1 | 0011010001 | 0 |
| 10001111 | 1011010011 | 1 | 0011010010 | 0 |
| 10010000 | 1101010011 | 1 | 0011010100 | 0 |
| 10010001 | 1100010011 | 0 | 0011011000 | 0 |
| 10010010 | 0111100011 | 1 | 0011100001 | 0 |
| 10010011 | 1011100011 | 1 | 0011100010 | 0 |
| 10010100 | 1101100011 | 1 | 0011100100 | 0 |
| 10010101 | 1100100011 | 0 | 0011101000 | 0 |
| 10010110 | 0010111101 | 1 | 0100001011 | 0 |
| 10010111 | 0100111101 | 1 | 0100001101 | 0 |
| 10011000 | 1000111101 | 1 | 0100001110 | 0 |
| 10011001 | 0011011101 | 1 | 0100010011 | 0 |
| 10011010 | 0101011101 | 1 | 0100010101 | 0 |
| 10011011 | 1001011101 | 1 | 0100010110 | 0 |
| 10011100 | 0110011101 | 1 | 0100011001 | 0 |
| 10011101 | 1010011101 | 1 | 0100011010 | 0 |
| 10011110 | 1100011101 | 1 | 0100011100 | 0 |
| 10011111 | 0011101101 | 1 | 0100100011 | 0 |
| 10100000 | 0101101101 | 1 | 0100100101 | 0 |
| 10100001 | 1001101101 | 1 | 0100100110 | 0 |
| 10100010 | 0110101101 | 1 | 0100101001 | 0 |
| 10100011 | 1010101101 | 1 | 0100101010 | 0 |
| 10100100 | 1100101101 | 1 | 0100101100 | 0 |
| 10100101 | 0111001101 | 1 | 0100110001 | 0 |
| 10100110 | 1011001101 | 1 | 0100110010 | 0 |
| 10100111 | 1101001101 | 1 | 0100110100 | 0 |
| 10101000 | 1100001101 | 0 | 0100111000 | 0 |
| 10101001 | 0011110101 | 1 | 0101000011 | 0 |
| 10101010 | 0101110101 | 1 | 0101000101 | 0 |
| 10101011 | 1001110101 | 1 | 0101000110 | 0 |
| 10101100 | 0110110101 | 1 | 0101001001 | 0 |
| 10101101 | 1010110101 | 1 | 0101001010 | 0 |
| 10101110 | 1100110101 | 1 | 0101001100 | 0 |
| 10101111 | 0111010101 | 1 | 0101010001 | 0 |

TABLE 5

| | input flag = 0 | | input flag = 1 | |
|---|---|---|---|---|
| source data (eight bits) | modulation data (ten bits) | output flag | modulation data (ten bits) | output flag |
| 10110000 | 1011010101 | 1 | 0101010010 | 0 |
| 10110001 | 1101010101 | 1 | 0101010100 | 0 |
| 10110010 | 1100010101 | 0 | 0101011000 | 0 |
| 10110011 | 0111100101 | 1 | 0101100001 | 0 |
| 10110100 | 1011100101 | 1 | 0101100010 | 0 |
| 10110101 | 1101100101 | 1 | 0101100100 | 0 |
| 10110110 | 1100100101 | 0 | 0101101000 | 0 |
| 10110111 | 0011110001 | 0 | 0110000011 | 0 |
| 10111000 | 0101111001 | 1 | 0110000101 | 0 |
| 10111001 | 1001111001 | 1 | 0110000110 | 0 |
| 10111010 | 0110111001 | 1 | 0110001001 | 0 |
| 10111011 | 1010111001 | 1 | 0110001010 | 0 |
| 10111100 | 1100111001 | 1 | 0110001100 | 0 |
| 10111101 | 0111011001 | 1 | 0110010001 | 0 |
| 10111110 | 1011011001 | 1 | 0110010010 | 0 |
| 10111111 | 1101011001 | 1 | 0110010100 | 0 |
| 11000000 | 1100011001 | 0 | 0110011000 | 0 |
| 11000001 | 0111101001 | 1 | 0110100001 | 0 |
| 11000010 | 1011101001 | 1 | 0110100010 | 0 |
| 11000011 | 1101101001 | 1 | 0110100100 | 0 |
| 11000100 | 1100101001 | 0 | 0110101000 | 0 |

TABLE 5-continued

| | input flag = 0 | | input flag = 1 | |
|---|---|---|---|---|
| source data (eight bits) | modulation data (ten bits) | output flag | modulation data (ten bits) | output flag |
| 11000101 | 0010111110 | 1 | 1000001011 | 0 |
| 11000110 | 0100111100 | 0 | 1000001101 | 0 |
| 11000111 | 1000111100 | 0 | 1000001110 | 0 |
| 11001000 | 0011011110 | 1 | 1000010011 | 0 |
| 11001001 | 0101011110 | 1 | 1000010101 | 0 |
| 11001010 | 1001011110 | 1 | 1000010110 | 0 |
| 11001011 | 0110011110 | 1 | 1000011001 | 0 |
| 11001100 | 1010011110 | 1 | 1000011010 | 0 |
| 11001101 | 1100011110 | 1 | 1000011100 | 0 |
| 11001110 | 0011101110 | 1 | 1000100011 | 0 |
| 11001111 | 0101101110 | 1 | 1000100101 | 0 |
| 11010000 | 1001101110 | 1 | 1000100110 | 0 |
| 11010001 | 0110101110 | 1 | 1000101001 | 0 |
| 11010010 | 1010101110 | 1 | 1000101010 | 0 |
| 11010011 | 1100101110 | 1 | 1000101100 | 0 |
| 11010100 | 0111001110 | 1 | 1000110001 | 0 |
| 11010101 | 1011001110 | 1 | 1000110010 | 0 |
| 11010110 | 1101001110 | 1 | 1000110100 | 0 |
| 11010111 | 1100001110 | 0 | 1000111000 | 0 |
| 11011000 | 0011110110 | 1 | 1001000011 | 0 |
| 11011001 | 0101110110 | 1 | 1001000101 | 0 |
| 11011010 | 1001110110 | 1 | 1001000110 | 0 |
| 11011011 | 0110110110 | 1 | 1001001001 | 0 |

TABLE 6

| | input flag = 0 | | input flag = 1 | |
|---|---|---|---|---|
| source data (eight bits) | modulation data (ten bits) | output flag | modulation data (ten bits) | output flag |
| 11011100 | 1010110110 | 1 | 1001001010 | 0 |
| 11011101 | 1100110110 | 1 | 1001001100 | 0 |
| 11011110 | 0111010110 | 1 | 1001010001 | 0 |
| 11011111 | 1011010110 | 1 | 1001010010 | 0 |
| 11100000 | 1101010110 | 1 | 1001010100 | 0 |
| 11100001 | 1100010110 | 0 | 1001011000 | 0 |
| 11100010 | 0111100110 | 1 | 1001100001 | 0 |
| 11100011 | 1011100110 | 1 | 1001100010 | 0 |
| 11100100 | 1101100110 | 1 | 1001100100 | 0 |
| 11100101 | 1100100110 | 0 | 1001101000 | 0 |
| 11100110 | 0011110010 | 0 | 1010000011 | 0 |
| 11100111 | 0101111010 | 1 | 1010000101 | 0 |
| 11101000 | 1001111010 | 1 | 1010000110 | 0 |
| 11101001 | 0110111010 | 1 | 1010001001 | 0 |
| 11101010 | 1010111010 | 1 | 1010001010 | 0 |
| 11101011 | 1100111010 | 1 | 1010001100 | 0 |
| 11101100 | 0111011010 | 1 | 1010010001 | 0 |
| 11101101 | 1011011010 | 1 | 1010010010 | 0 |
| 11101110 | 1101011010 | 1 | 1010010100 | 0 |
| 11101111 | 1100011010 | 0 | 1010011000 | 0 |
| 11110000 | 0111101010 | 1 | 1010100001 | 0 |
| 11110001 | 1011101010 | 1 | 1010100010 | 0 |
| 11110010 | 1101101010 | 1 | 1010100100 | 0 |
| 11110011 | 1100101010 | 0 | 1010101000 | 0 |
| 11110100 | 0101111000 | 0 | 0001111010 | 1 |
| 11110101 | 1101101000 | 0 | 0001011011 | 1 |
| 11110110 | 1011101000 | 0 | 0001011101 | 1 |
| 11110111 | 0111101000 | 0 | 0001011110 | 1 |
| 11111000 | 1101011000 | 0 | 0001101011 | 1 |
| 11111001 | 1011011000 | 0 | 0001101101 | 1 |
| 11111010 | 0111011000 | 0 | 0001101110 | 1 |
| 11111011 | 1100111000 | 0 | 0001110011 | 1 |
| 11111100 | 1010111000 | 0 | 0001110101 | 1 |
| 11111101 | 0110111000 | 0 | 0001110110 | 1 |
| 11111110 | 1001111000 | 0 | 0001111001 | 1 |
| 11111111 | 1101100100 | 0 | 0010011011 | 1 |

A data conversion look-up table has been used to perform such data conversion. The data conversion look-up table is constituted by a memory addressed by an input flag and source data. Here, each address consists of nine bits (eight bits of source data plus one bit for the input flag). The ten-bit modulation data and one bit output flag are stored in the respective addresses of the memory.

While, as described above, the conventional data conversion look-up table can be easily realized, a relatively large ($2^9$ 11) memory is required. Thus, the semiconductor chip for realizing such a function becomes excessively large, which increases the manufacturing cost thereof and makes it difficult for the data conversion look-up table to be manufactured in a single-chip package together with other function circuits.

SUMMARY OF THE INVENTION

Therefore, an object of the present invention is to provide a data conversion apparatus which can perform data conversion more efficiently.

To accomplish the above object, there is provided a data conversion apparatus for converting a source data into a modulation data which comprises a compressed look-up table for sequentially converting i) a first address including the source data and an original input flag into first tentative data and a first tentative flag, and ii) a second address including the source data and a modulated input flag into second tentative data and a second tentative flag. A group discriminator discriminates the source data in accordance with a bit pattern thereof so as to produce a group discrimination signal, and a noneffective data discriminator produces a non-effective data detection signal when the first tentative data produced by the compressed look-up table is noneffective data. An output flag generator generates an output flag as a function of one of the tentative flags and the non-effective data detection signal, while a flag modulator provides the original input flag and the modulated input flag sequentially to the compressed look-up table based on the non-effective data detection signal produced by the non-effective data discriminator and the output flag generated by the output flag generator. A control signal generator produces a control signal based on the non-effective data detection signal and the group discrimination signal. Finally, an output compensator produces the modulation data by modulating the second tentative data as a function of the control signal.

In one embodiment, the source data is eight-bit data, the modulation data is ten-bit data, and the non-effective data produced from the compressed look-up table consists entirely of logic "0" bits.

The non-effective data discriminator comprises a logic unit for producing the signal activated when the five high significant bits among the first tentative data are all "0" and a first latch for latching the output of the logic unit.

The flag modulator comprises a first inverter for inverting the output of the output flag generator and a first NOR gate for performing a logic NOR operation with respect to the non-effective data detection signal and the output of the first inverter.

The group discriminator produces a first group discrimination signal activated when the source data is between $(00000000)_2$ and $(01011000)_2$, a second group discrimination signal activated when the source data is between $(01011001)_2$ and $(11110011)_2$, and a third group discrimination signal activated when the source data is between $(11110100)_2$ and $(11111111)_2$.

The control signal generator produces a first control signal activated when the non-effective data detection signal is non-active or the first group discrimination signal is active;

a second control signal activated when the noneffective data detection signal is active and the first group discrimination signal is active; and a third control signal activated when the non-effective data detection signal is active and the second group discrimination signal is active.

The output compensator produces the second tentative data as the modulation data when the first control signal is active; produces the data obtained by inverting and rearranging in the reverse bit sequence the second tentative data as the modulation data when the second control signal is active; and produces the data obtained by rearranging in the reverse bit sequence the second tentative data as the modulation data when the third control signal is active. The output compensator has a plurality of selectors and a plurality of second latches.

The output flag generator according to one embodiment includes a combinational logic circuit for receiving a non-effective data detection signal E, a tentative flag FT and group discrimination signals G1, G2 and G3 and thereby generating the output flag (FO) in accordance with the following equation $$FO=(E'^\wedge FT)^V(E^\wedge G1^\wedge FT')^V(E^\wedge G2^\wedge FT)^V(E^\wedge G3^\wedge FT')$$

where "$^V$" represents an OR operation, "$^\wedge$" represents an AND operation and "'" represents an inversion; and a third latch for latching the output of the combinational logic circuit so as to produce the latched data such that the latched data corresponds to the next input source data.

The output flag generator according to another embodiment, generates an output flag FO in accordance with the following equation $$FO=(E'^\wedge FT2)^V(E^\wedge FT2'),$$

assuming that the second tentative flag FT2 and the noneffective detection signal E.

BRIEF DESCRIPTION OF THE DRAWINGS

The above objects and other advantages of the present invention will become more apparent by the following detailed description of a preferred embodiment thereof with reference to the attached drawings in which.

DETAILED DESCRIPTION OF THE INVENTION

Referring to Tables 1 through 6, the source data is divided into the following four groups according to a correlation between source data/input flag and modulation data/output flag.

First group: source data generally between $(00000000)_2$–$(01011000)_2$

Second group: source data of Table 7 below

Third group: source data generally between $(01011001)_2$–$(11110011)_2$, but excluding that of the second group Fourth group: source data generally between $(11110100)_2$–$(11111111)_2$

TABLE 7

| | <second group> | | | |
|---|---|---|---|---|
| | input flag = 0 | | input flag = 1 | |
| source data | modulation data | output flag | modulation data | output flag |
| 01011101 | 1001110001 | 0 | 0000110101 | 0 |
| 01011110 | 1001011100 | 0 | 0000110110 | 0 |
| 01100001 | 1001101100 | 0 | 0000111100 | 0 |
| 01110100 | 0110110001 | 0 | 0001111000 | 0 |
| 10000111 | 1100001011 | 0 | 0010111000 | 0 |
| 10010001 | 1100010011 | 0 | 0011011000 | 0 |
| 10010101 | 1100100011 | 0 | 0011101000 | 0 |
| 10101000 | 1100001101 | 0 | 0100111000 | 0 |
| 10110010 | 1100010101 | 0 | 0101011000 | 0 |
| 10110110 | 1100100101 | 0 | 0101101000 | 0 |
| 10110111 | 0011110001 | 0 | 0110000011 | 0 |
| 11000000 | 1100011001 | 0 | 0110011000 | 0 |
| 11000100 | 1100101001 | 0 | 0110101000 | 0 |
| 11000110 | 0100111100 | 0 | 1000001101 | 0 |
| 11000111 | 1000111100 | 0 | 1000001110 | 0 |
| 11010111 | 1100001110 | 0 | 1000111000 | .0 |
| 11100001 | 1100010110 | 0 | 1001011000 | 0 |
| 11100101 | 1100100110 | 0 | 1001101000 | 0 |
| 11100110 | 0011110010 | 0 | 1010000011 | 0 |
| 11101111 | 1100011010 | 0 | 1010011000 | 0 |
| 11110011 | 1100101010 | 0 | 1010101000 | 0 |

Hereinbelow, for the sake of explanation, the modulation data values and output flag which correspond to the input flag "0" are referred to as first-type modulation data and a first-type output flag, while those corresponding to the input flag "1" are referred to as second-type modulation data and a second-type output flag.

As shown in Tables 1 to 6, in the first group, the first- and second-type modulation data corresponding to the respective source data values remain the same throughout the group, the first-type output flag being "0," and the second-type output flag being "1."

In the second group, the first- and second-type modulation data corresponding to the respective source data values are irregular, and the first and second-type output flags are "0" in each case.

In the third group, the first-type modulation data corresponding to the respective source data values is obtained by inverting the second-type modulation data and then arranging the inverted data in the reverse bit sequence. Likewise, the second-type modulation data is obtained by inverting the first-type modulation data and then arranging the inverted data in the reverse bit sequence. Meanwhile, the first- and second-type output flags corresponding to the respective source data values belonging to the third group have opposite values.

In the fourth group, the first-type modulation data corresponding to respective source data values are obtained by arranging the second-type modulation data in the reverse bit sequence. Likewise, the second-type modulation data is obtained by arranging the first-type modulation data in the reverse bit sequence.

Figure 1:
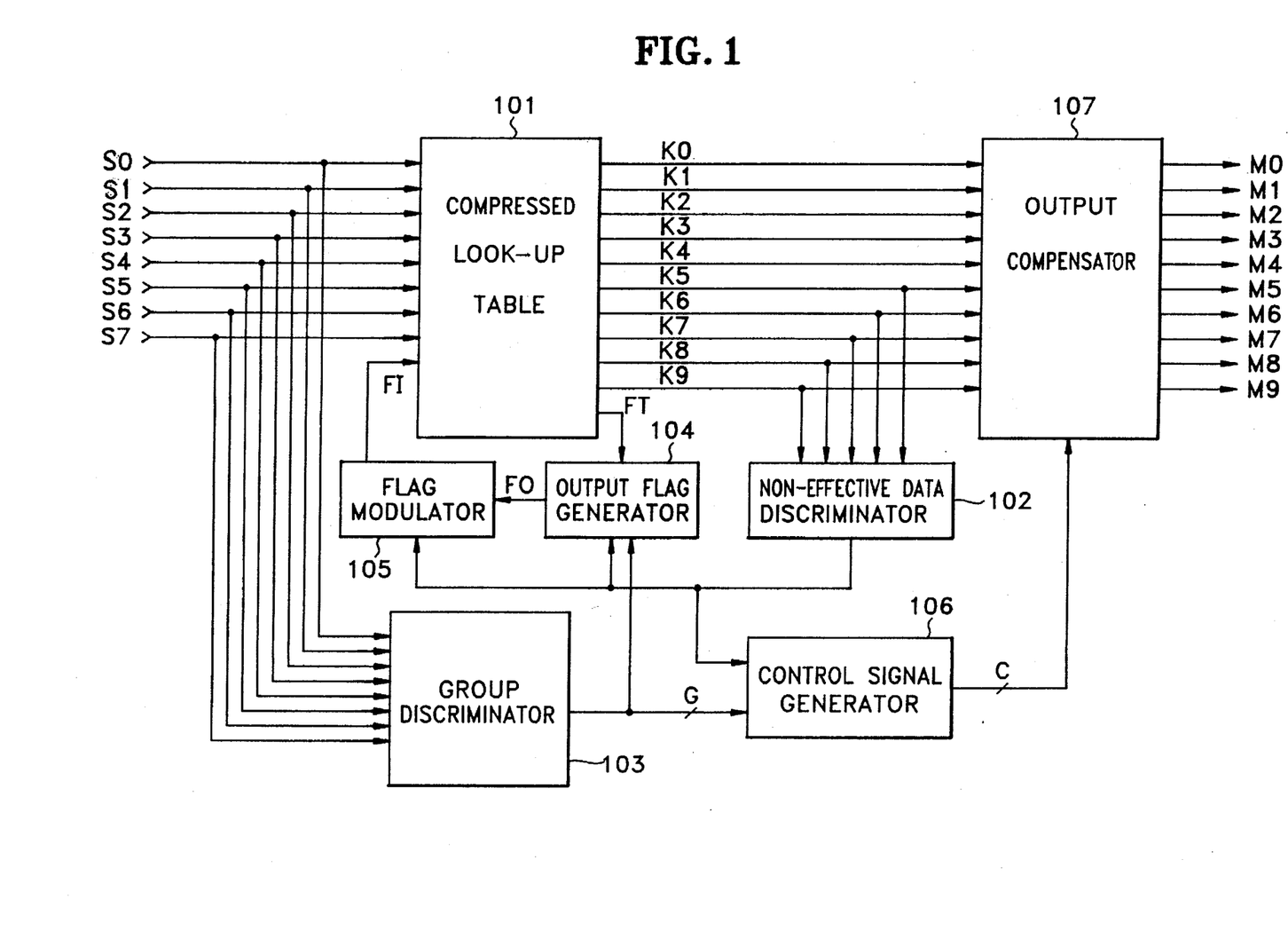
FIG. 1 is a block diagram of the data conversion apparatus according to the present invention.

FIG. 1 is a block diagram of the data conversion apparatus according to the present invention. The apparatus includes a compressed look-up table 101, a non-effective data discriminator 102, a group discriminator 103, an output flag generator 104, a flag modulator.

In FIG. 105, a control signal generator 106, and an output compensator 107.

In FIG. 1, the compressed look-up table 101 stores the first-type modulation data and first-type output flags corresponding to all source data, and the second-type modulation data and second-type output flags corresponding to the source data of the second group. Alternatively, the compressed look-up table 101 can store the second-type modulation data and second-type output flags corresponding to the source data of the first through fourth groups, and the first-type modulation data and first-.type output flags corresponding to the source data of the second group.

In other words, as opposed to the conventional data conversion look-up table, the compressed look-up table 101 does not store the second-type modulation data and second-type output flag corresponding to the first, third and fourth groups. Alternatively, the compressed look-up table 101 may not store the first-type modulation data and first-type output flag corresponding to the first, third and fourth groups.

Hereinafter, the case of the compressed look-up table storing the first-type modulation data and first-type output flag corresponding to all groups, the second-type modulation data and second-type Output flag corresponding to the second group, will be described.

The compressed look-up table 101 includes multiple memory elements and the respective memory elements are addressed by eight-bit source data (S7 S6 S5 S4 S3 S2 S1 S0)$_2$ and an input flag FI. With the same source data, an original input flag and a modulated input flag are sequentially applied to compressed look-up table 101. In other words, a first address composed of the source data and the original input flag and a second address composed of the source data and the modulated input flag are sequentially applied. Here, we assume that the output of the compressed look-up table 101 corresponding to the source data and original input flag are a first tentative data and a first tentative flag, while the output corresponding to the source data and modulated input flag are second tentative data and a second tentative flag.

In the case where the address comprising source data and input flag is a non-effective address, that is, an address composed of source data belonging to first, third and fourth groups and an input flag of "1," then the compressed lookup table 101 produces unique non-effective data, for example, tentative data of (0000000000)$_2$ and a tentative flag of "0." In this manner, none of the non-effective data values are the same as any of the modulation-data and output-flag values. Here, FT represents a tentative flag among the outputs of the compressed look-up table 101, and (K9 K8 K7 K6 K5 K4 K3 K2 K1 K0) represents tentative data. Source data is applied in synchronization with a first clock CK1, and the input flag is applied in synchronization with a second clock CK2 which is twice the frequency of first clock CK1 (See FIG. 2). Thus, the original input flag and the modulated input flag are sequentially applied in synchronization with the second clock CK2, with respect to the same source data.

The non-effective data discriminator 102 discriminates whether the first tentative data produced from the compressed look-up table 101 is a noneffective data value. In one embodiment, the non-effective data discriminator 102 receives the five high significant bits (K9, K8, K7, K6, K5) of the first tentative data, so as to produce a non-effective-:data detection signal E when the first tentative data is a non-effective data value.

Figure 3:
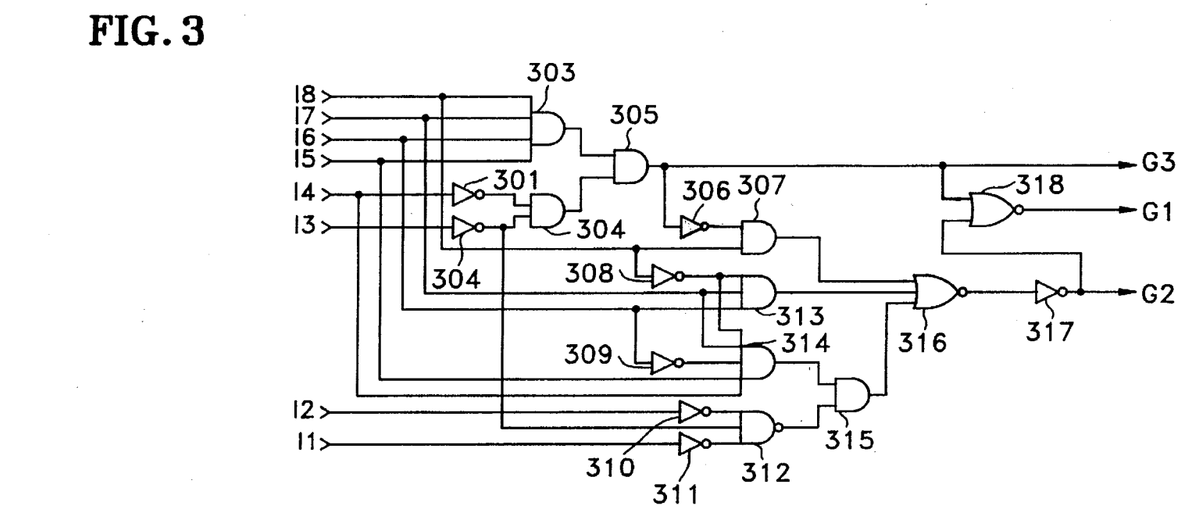
FIG. 3 is a logic circuit diagram of one embodiment of the group discriminator shown in FIG. 1.

The group discriminator 103 produces discrimination signals G, which include a first group discrimination signal G1, a second group discrimination signal G2, and a third group discrimination signal G3 (e.g., see FIG. 3). The first group discrimination signal G1 is activated when the eight-bit source data value is between (00000000)$_2$ and (01011000)$_2$, the second group discrimination signal G2 is activated when the eight-bit source data value is between (01011001)$_2$ and (11110011)$_2$, and the third group discrimination signal G3 is activated when the eight-bit source data value is between (11110011)$_2$ and (11111111)$_2$. In other words, G1 is activated when the source data belongs to the first group, G2 is activated when the source data belongs to the second or third group, and G3 is activated when the source data belongs to the fourth group.

Figure 4:
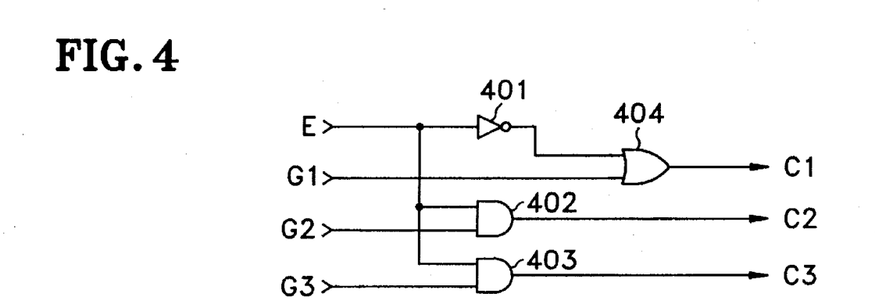
FIG. 4 is a logic circuit diagram of one embodiment of the control signal generator shown in FIG. 1.

The control signal generator 106 produces control signals C, including a first control signal C1, a second control signal C2 and a third control signal C3, based on the non-effective data detection signal E and the group discrimination signals G1, G2 and G3 (See FIG. 4).

The first control signal C1 is activated when the source data belongs to the first group or when the non-effective data detection signal E is non-active, the second control signal C2 is activated when the source data belongs to the second or third group and when the non-effective data detection signal E is active, and the third control signal C3 is activated when the source data belongs to the fourth group and when the non-effective data detection signal E is active. This is summarized in the following Table 8.

TABLE 8

| source data | E | C1 | C2 | C3 |
|---|---|---|---|---|
| | non-active | active | non-active | non-active |
| first group (G1 = active) | | active | non-active | non-active |
| second or third group (G2 = active) | active | non-active | active | non-active |
| fourth group (G3 = non-active) | active | non-active | non-active | active |

("x" indicates the "don't care" condition)

The output flag generator 104 generates an output flag FO, based on first, second and third group discrimination signals G1, G2 and G3, a non-effective data detection signal E, and a first tentative flag FT. The output flag FO is output in synchronization with the first clock CK1, wherein the output flag corresponds to the original input flag at the next clock signal. In other words, the output flag of the previous conversion is used as the original input flag of the present conversion.

The flag modulator 105 receives the non-effective data detection signal E and the output of the output flag generator so as to sequentially produce the original input flag and the modulated input flag. Here, the output of the flag modulator 105 is equal to the output of the output flag generator 104 when the non-effective data detection signal E is non-active, and is equal to the inversion of the output of the output flag generator 104 when the non-effective data detection signal E is active.

Therefore, the original input flag of the present conversion is equal to the output flag of the previous conversion.

The modulated input flag of the present conversion is the inverted value of the output flag of the previous conversion when the non-effective data detection signal E is active, and the modulated input flag is equal to the output flag of the previous conversion when the non-effective data detection signal E is non-active. Thus, the first and second tentative data produced from the compressed look-up table 101 are shown in the following Table 9. For comparison, Table 9 also shows the modulation data corresponding to the respective source data and original input flag.

TABLE 9

| source data | source input flag | first tentative data | second tentative data | modulation data |
|---|---|---|---|---|
| first group | 0 | first-type modulation data | first-type modulation data | first-type modulation data |
| first group | 1 | non-effective data | first-type modulation data | second-type modulation data |
| second group | 0 | first-type modulation data | first-type modulation data | first-type modulation data |
| second group | 1 | second-type modulation data | second-type modulation data | second-type modulation data |
| third group | 0 | first-type modulation data | first-type modulation data | first-type modulation data |
| third group | 1 | non-effective data | first-type modulation data | second-type modulation data |
| fourth group | 0 | first-type modulation data | first-type modulation data | first-type modulation data |
| fourth group | 1 | non-effective data | first-type modulation data | second-type modulation data |

As shown in Table 9, by compensating the second tentative data suitably, the modulation data corresponding to the source data and original input flag is obtained. The output compensator 107, which performs such function, produces the modulation data by modulating the second tentative data produced from the compressed look-up table 101 based on the output of the control signal generator 106.

The modulation data is composed of the ten bits of $(M9\ M8\ M7\ M6\ M5\ M4\ M3\ M2\ M1\ M0)_2$. The modulation data is equal to the second tentative data when the first control signal C1 is active, is equal to the data obtained by inverting and arranging in the reverse bit sequence the second tentative data when the second control signal C2 is active, and is equal to the data obtained by arranging in the reverse bit sequence the second tentative data when the third control signal C3 is active.

Figure 2:
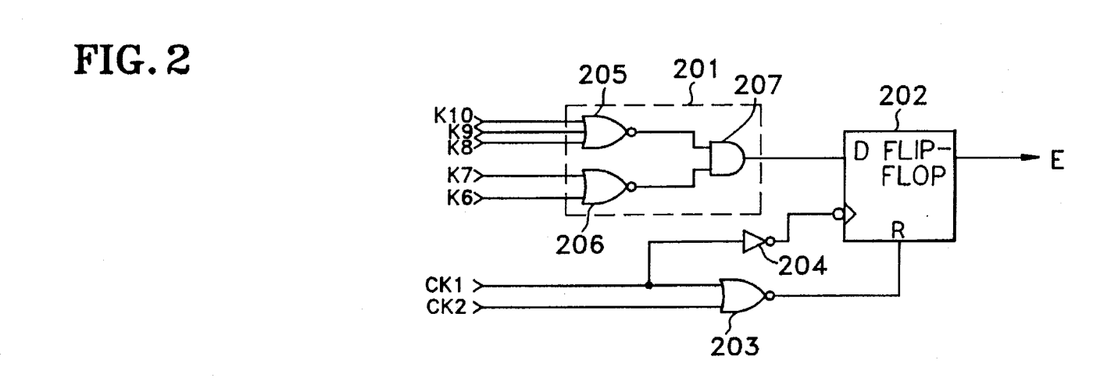
FIG. 2 is a logic circuit diagram of one embodiment of the non-effective data discriminator shown in FIG. 1.

FIG. 2 is a logic circuit diagram of one embodiment of the non-effective data discriminator shown in FIG. 1. Here, the noneffective data discriminator includes a logic unit 201 and a D flip-flop 202.

In FIG. 2, the logic unit 201 performs a logic NOR operation with respect to the five high significant bits (e.g., K6–K10) of the first tentative data produced by the compressed look-up table, and includes NOR gates 205 and 206 and an AND gate 207. The D flip-flop 202, functions as a latch and is reset at an initial time when the source data is applied to the compressed look-up table 101. For this purpose, the reset node of the D flip-flop 202 is supplied with a reset signal from a NOR gate 203, which performs a logic NOR operation with respect to the first clock CK1 and second clock CK2. Meanwhile, the first clock CK1 is inverted by an inverter 204 and is then applied to the clock node of the D flip-flop 202. As a result, the D flip-flop 202 produces the non-effective data detection signal E activated when the five high significant bits of the first tentative data among the outputs of the compressed look-up table 101 are all "1's."

FIG. 3 is a logic circuit diagram of one embodiment of the group discriminator shown in FIG. 1. Here, the group discriminator includes a plurality of AND gates 303, 304, 305, 307, 313, 314 and 315, a plurality of inverters 301, 302, 306, 308, 309, 310, 311 and 317, two NOR gates 316 and 318, and a NAND gate 312.

In FIG. 3, the AND gate 305 produces the third group discrimination signal G3 when the source data belongs to the fourth group, the NOR gate 318 produces the first group discrimination signal G1 when the source data belongs to the first group, and the inverter 317 produces the second group discrimination signal G2 when the source data belongs to the second or third group.

The group discriminator shown in FIG. 3 is one of many possible combinational logic circuits which can perform the function of the aforementioned group discriminator 103. Here, only one signal among the first, second and third group discrimination signals G1, G2 and G3 is activated with respect to an eight-bit source data.

FIG. 4 is a logic circuit diagram of one embodiment of the control signal generator shown in FIG. 1, Here, the control signal generator includes an inverter 401, an OR gate 404, and AND gates 402 and 403.

In FIG. 4, the inverter 401 inverts the non-effective data detection signal E, and the OR gate 404 produces the first control signal C1 by performing a logic OR operation with respect to the first group discrimination signal G1 and the output of inverter 401. The AND gate 402 produces the second control signal C2, by performing a logic AND operation with respect to the non-effective data detection signal E and the second group discrimination signal G2, and the AND gate 403 produces the third control signal C3, by performing a logic AND operation with respect to the non-effective data detection signal E and the third group discrimination signal G3.

Figure 5:
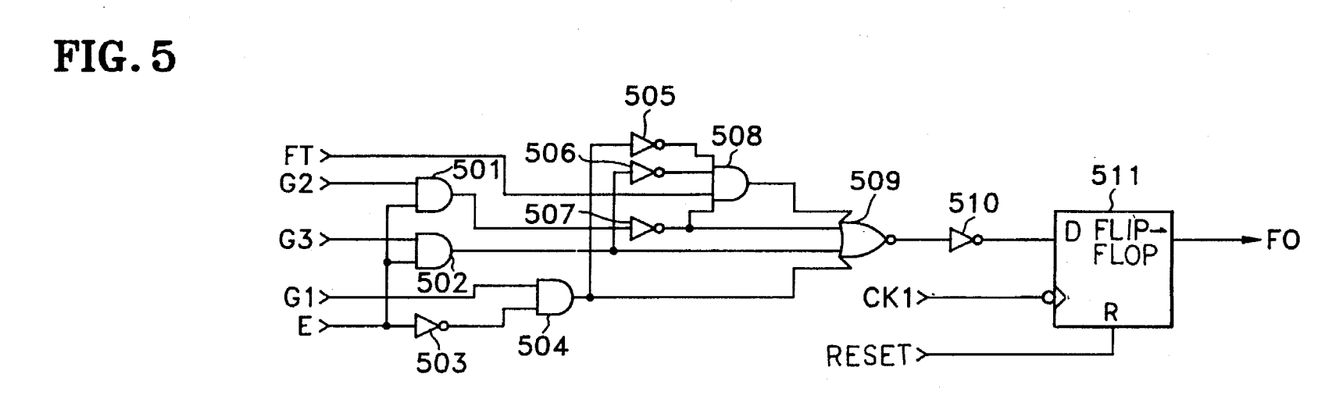
FIG. 5 is a logic circuit diagram of one embodiment of the output flag generator shown in FIG. 1.

FIG. 5 is a logic circuit diagram of one embodiment of the output flag generator shown in FIG. 1. Here, the output flag generator includes a plurality of AND gates 501, 502, 504 and 508, a plurality of inverters 503, 505, 506, 507 and 510, and a D flip-flop 511.

The following Table 10 shows the variation of the non-effective data detection signal E, first tentative flag, second tentative flag and output flag with respect to the four different groups and the original input flag.

TABLE 10

| Source input flag | group | E | first tentative flag | second tentative flag | FO |
|---|---|---|---|---|---|
| 0 | first group | non-active | 0 | 0 | 0 |

TABLE 10-continued

| Source input flag | group | E | first tentative flag | second tentative flag | FO |
|---|---|---|---|---|---|
| | second group | non-active | 0 | 0 | 0 |
| | third group | non-active | 1 | 1 | 1 |
| | fourth group | non-active | 0 | 0 | 0 |
| 1 | first group | active | 0 | 0 | 1 |
| | second group | non-active | 0 | 0 | 0 |
| | third group | active | 0 | 1 | 0 |
| | fourth group | active | 0 | 0 | 1 |

The relation between the first tentative flag and output flag FO shown in Table 10 is as follows. If the source data belongs to the first group and the original input flag is "1" or if the source data belongs to the fourth group and the original input flag is "1," the output flag FO is equal to the inverse of the first tentative flag. In all other cases, the Output flag FO is the same as the first tentative flag.

In other words, if the non-effective data detection signal E is non-active, the output flag FO has the same value as the first tentative flag. If the non-effective data detection signal E is active and the first group discrimination Signal G1 is active, the output flag FO becomes the inverted value of the first tentative flag; that is, the output flag becomes "1." If the non-effective data detection signal E is active and the second group discrimination signal G2 is active, the output flag FO becomes the same as the first tentative flag. If the non-effective data detection signal E is active and the third group discrimination signal G3 is active, the output flag FO becomes the inverse of the first tentative flag.

Therefore, the value of output flag FO Can be expressed by the following equation 1:

$$FO = (E' \wedge FT1) \vee (E \wedge G1 \wedge FT1') \vee (E \wedge G2 \wedge FT1) \vee (E \wedge G3 \wedge FT1') \quad (1)$$
$$= (E' \wedge FT1) \vee (E \wedge G1) \vee (E \wedge G3)$$

Here, the symbol "$\vee$" represents a logic OR operation, the symbol "$\wedge$" represents a logic AND operation, the symbol "'" represents a logic inversion, and FT1 is the first tentative flag.

Meanwhile, referring to above Table 10 above, the relationship between the output flag FO and the second tentative flag can be described as follows.

If the non-effective data detection signal E is nonactive, that is, if the original input flag is "0" or the source data corresponds to the second group, then the output flag FO is the same as the second tentative flag. On the other hand, if the non-effective data detection signal E is active, that is, if the original input flag is "1" and the source data corresponds to the first, third or fourth groups, then the output flag FO is the same as the inverted second tentative flag.

Therefore, assuming that the second tentative flag is FT2, the value output flag FO can be expressed by the following equation (2):

$$FO = (E' \wedge FT2) \vee (E \wedge G1 \wedge FT2') \vee (E \wedge G2 \wedge FT2') \vee (E \wedge G3 \wedge FT2') \quad (2)$$
$$= (E' \wedge FT2) \vee (E \wedge FT2')$$
$$= (FT2 \wedge E') \vee (E \wedge (G1 \vee G3))$$

Gate circuitry is used to the above equations (1) and (2), thereby realizing the output flag generator 104 as shown in FIG. 5.

Figure 6:
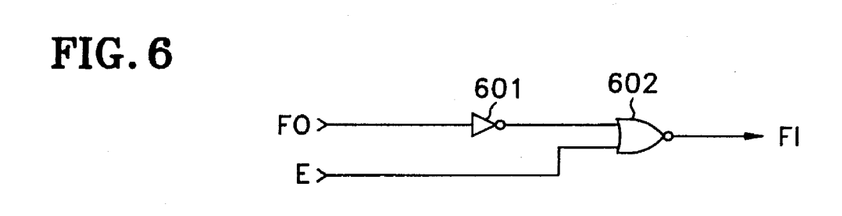
FIG. 6 is a logic circuit diagram of one embodiment of the flag modulator shown in FIGS. 1.

FIG. 6 is a logic circuit diagram of one embodiment of the flag modulator shown in FIG. 1. Here, the flag modulator includes an inverter 601 and a NOR gate 602.

The inverter 601 inverts the output flag FO, and the NOR gate 602 performs a logic NOR operation with respect to the non-effective data detection signal E and the output of inverter 601. As described above, the source data is applied in synchronization with the first clock CK1, and the input flag is applied in synchronization with the second clock CK2, wherein the second clock CK2 is twice the frequency of first clock CK1. Also, the output flag generator 104 operates according to the first clock CK1.

Thus, the original input flag and the modulated input flag corresponding to given source data are applied to the compressed look-up table 101, as follows. The original input flag is equal to the output flag FO at the time of to the previous pulse of the first clock CK1. The modulated input flag is equal to the output flag FO at the time of the previous pulse of the first clock CK1 when the non-effective data detection signal E is non-active, and equal to the inverted output flag FO at the time of to the previous pulse of the first clock CK1 when the non-effective data detection signal E is active.

Figure 7:
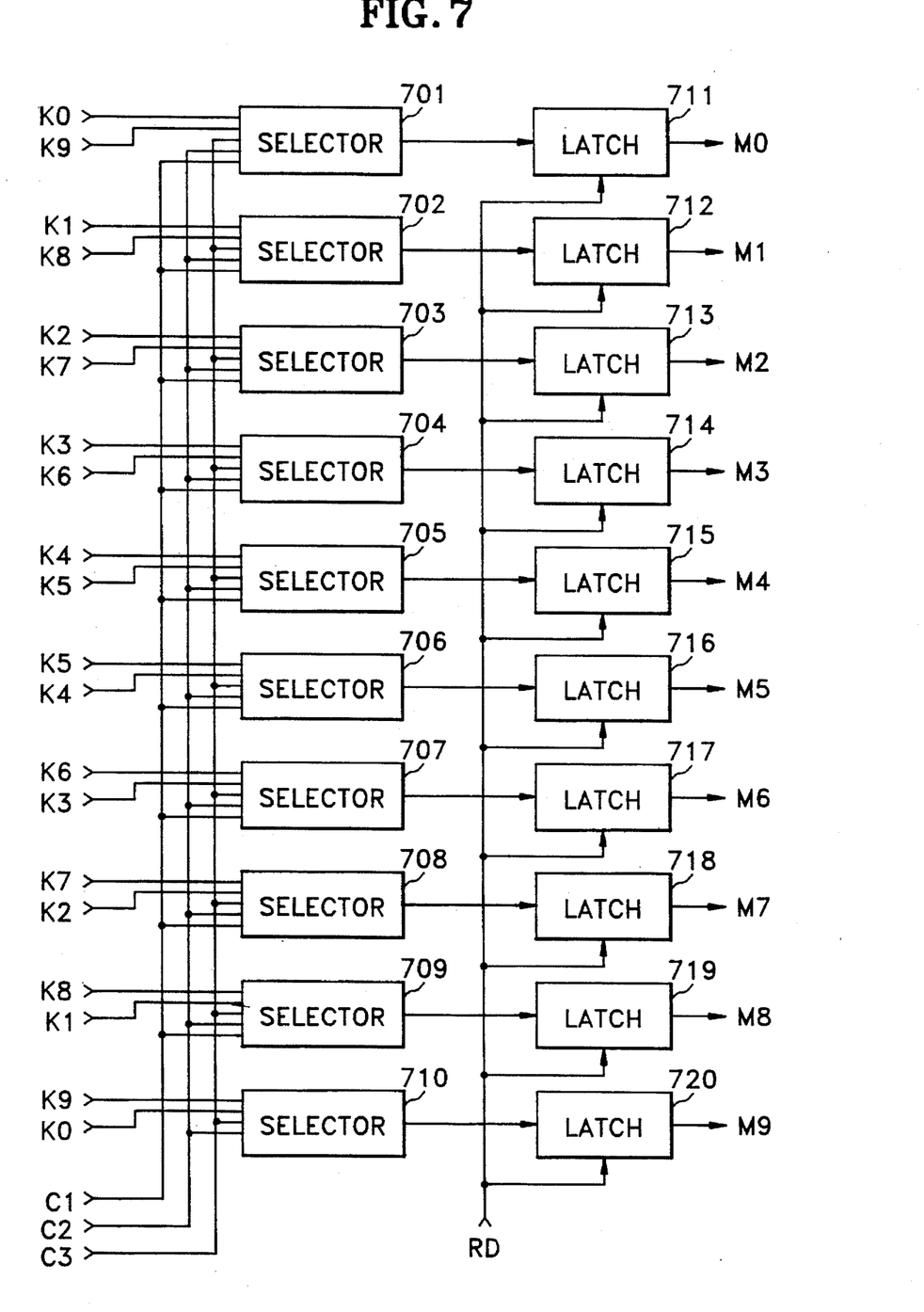
FIG. 7 is a detailed block diagram of one embodiment of the output compensator shown in FIG. 1.

FIG. 7 is a detailed block diagram of one embodiment of the output compensator shown in FIG. 1, Here, the output compensator includes a plurality of selectors 701 to 710 and a plurality of latches 711 to 720.

Referring to FIG. 7, the selectors each receive the corresponding bit K(n) of the second tentative data, the corresponding bit K(9n) of the data obtained by arranging in reverse bit sequence and inverting the second tentative data, and the first, second and third control signals C1, C2 and C3, where n represents the integers from 0 to 9.

Figure 8:
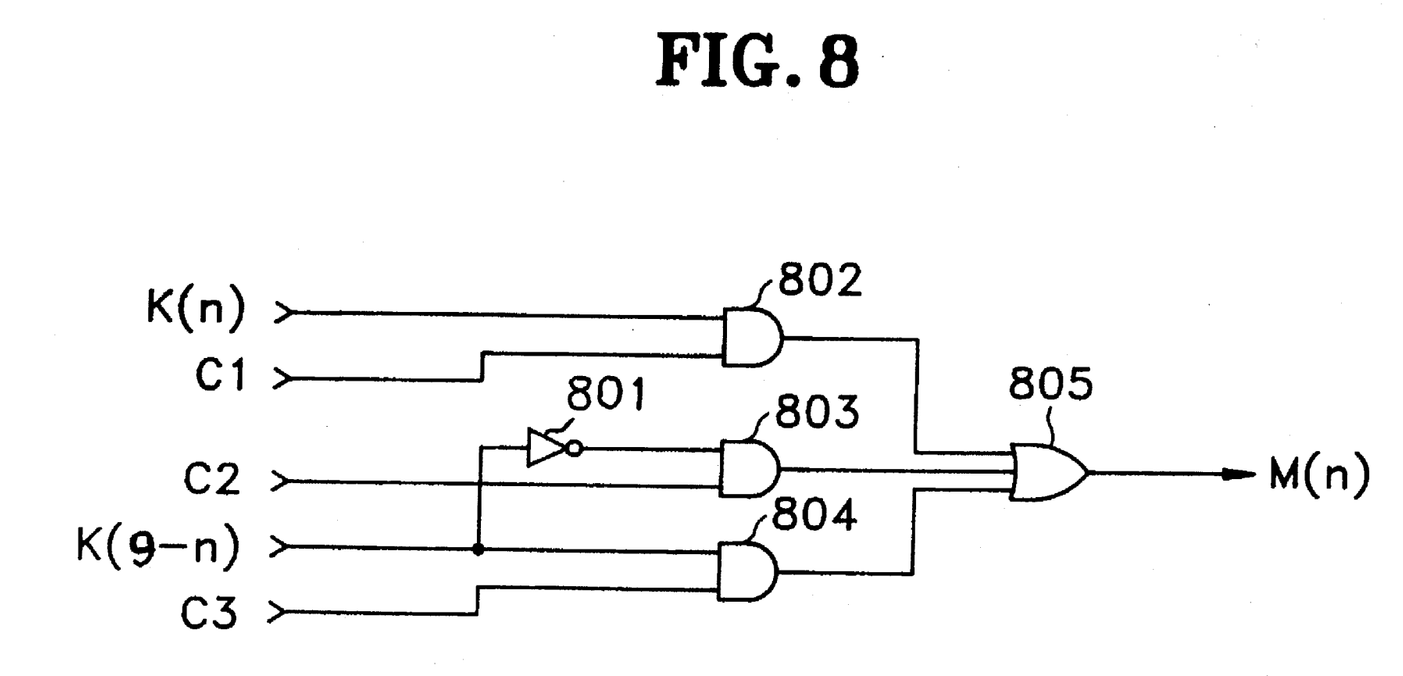
FIG. 8 is a logic circuit diagram of one embodiment of each selector shown in FIG. 7.

FIG. 8 is a logic circuit diagram of such a selector. The selector includes an inverter 801, a plurality of AND gates 802, 803 and 804, and an OR gate 805.

In FIG. 8, the output M(n) of the OR gate 805 can be represented by the following equation (3):

$$M(n) = [C1 \wedge K(n)] \vee [C2 \wedge K(9 n)'] \vee [C3 \wedge k(9 n)] \quad (3)$$

Thus, the selectors each produce K(n) if the first control signal C1 is active, K(9 n)' if the second control signal C2 is active, and K(9 n) if the third control signal C3 is active.

Referring back to FIG. 7, each of the of latches latch the output of the corresponding selector in synchronization with a reset signal and then produces a latched output of a respective one of the selectors.

As described above, since the apparatus according to the present invention constituted by a compressed look-up table and logic circuits can be realized by a device having a reduced memory capacity, the required chip size can be reduced. In addition, it is easy to realize the device in a single chip by merging the circuitry for performing other functions into the data conversion apparatus according to the present invention.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A data conversion apparatus for converting source data into modulation data, comprising:

a compressed look-up table for sequentially converting i) a first address including said source data and an original input flag into first tentative data and a first tentative flag, and ii) a second address including said source data and a modulated input flag into second tentative data and a second tentative flag;

a group discriminator for discriminating said source data in accordance with a bit pattern thereof so as to produce a group discrimination signal;

a non-effective data discriminator for producing a non-effective data detection signal when said first tentative data produced by said compressed look-up table is non-effective data;

an output flag generator for generating an output flag as a function of one of said tentative flags and said non-effective data detection signal;

a flag modulator for providing said original input flag and said modulated input flag sequentially to said compressed lookup table based on said non-effective data detection signal produced by the non-effective data discriminator and the output flag generated by the output flag generator;

a control signal generator for producing a control signal based on said non-effective data detection signal and said group discrimination signal; and an output compensator for producing said modulation data by modulating said second tentative data as a function of said control signal.

2. A data conversion apparatus as claimed in claim 1, wherein said source data is eight-bit data and Said modulation data is ten-bit data.

3. A data conversion apparatus as claimed in claim 1, wherein the non-effective data produced from said compressed look-up table consists entirely of logic "0" bits.

4. A data conversion apparatus as claimed in claim 3, wherein said non-effective data discriminator comprises a logic unit for outputting a signal when five high significant bits within said first tentative data are all "0", and a first latch for latching the signal output by said logic unit.

5. A data conversion apparatus as claimed in claim 1, wherein said flag modulator comprises a first inverter for inverting the output of said output flag generator, and a first NOR gate for performing a logic NOR operation with respect to said non-effective data detection signal and the output of said first inverter.

6. A data conversion apparatus as claimed in claim 1, wherein said group discriminator produces a first group discrimination signal when said source data comprises eight-bit data between $(00000000)_2$ and $(01011000)_2$, a second group discrimination signal when said source data comprises eight-bit data between $(01011001)_2$ and $(11110011)_2$, and a third group discrimination signal when said source data comprises eight-bit data between $(11110100)_2$ and $(11111111)_2$.

7. A data conversion apparatus as claimed in claim 6, wherein said control signal generator produces i) a first control signal when said non-effective data detection signal is non-active or when said first group discrimination signal is active, ii) a second control signal when said non-effective data detection signal is active and said first group discrimination signal is active, and iii) a third control signal when said noneffective data detection signal is active and said second group discrimination signal is active.

8. A data conversion apparatus as claimed in claim 7, wherein said output compensator i) produces said second tentative data as the modulation data when said first control signal is active ii) produces said modulation data by inverting and rearranging in reverse bit sequence said second tentative data when said second control signal is active, and iii) data obtained by rearranging in reverse bit sequence said second tentative data as the modulation data when said third control signal is active.

9. A data conversion apparatus as claimed in claim 8, wherein said output compensator comprises a plurality of selectors and a plurality of second latches.

10. A data conversion apparatus as claimed in claim 6, wherein said output flag generator comprises:

a combinational logic circuit for receiving a non-effective data detection signal E, a tentative flag FT, and group discrimination signals G1, G2 and G3 to thereby generate said output flag in accordance with the following equation $$FO=(E'^\wedge FT)\ (E^\wedge G1^\wedge FT')^V(\ E^\wedge G2^\wedge FT)^V(E^\wedge G3^\wedge FT')$$

where FO represents a value of said output flag, "$^V$" represents an OR operation, "$^\wedge$" represents an AND operation and "'" represents an inversion operation; and a third latch for latching an output of said combinational logic circuit so as to produce latched data when a next one of said input source data is produced.

11. A data conversion apparatus as claimed in claim 1, wherein said output flag generator receives said second tentative flag and said non-effective detection signal and generates said output flag in accordance with the equation $$FO=(E'^\wedge FT2)^V(E^\wedge FT2'),$$

where FO represents a value of said output flag, "$^V$" represents an OR operation, "$^\wedge$" represents an AND operation, FT2 represents a value of said second tentative flag, E represents a value of said non-effective detection signal, and "'" represents an inversion operation.

12. A data conversion apparatus as claimed in claim 1, wherein each said output flag is generated at a time at which subsequent input source data is produced.

* * * * *